(12) United States Patent
Stevenson

(10) Patent No.: US 7,228,118 B2
(45) Date of Patent: Jun. 5, 2007

(54) METHOD OF CALIBRATING PLL FREQUENCY SYNTHESIZERS TO PRECISE FREQUENCIES WITH LOW TOLERANCE CRYSTALS IN THEIR MASTER REFERENCE OSCILLATORS

(75) Inventor: Carl Stevenson, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 403 days.

(21) Appl. No.: 10/180,027

(22) Filed: Jun. 27, 2002

(65) Prior Publication Data

US 2004/0002316 A1   Jan. 1, 2004

(51) Int. Cl.
*H04B 1/06* (2006.01)

(52) U.S. Cl. .................. 455/259; 455/316; 331/25

(58) Field of Classification Search .............. 455/255, 455/265, 256, 258, 259, 315, 316, 317, 318, 455/71, 230, 257, 313, 314; 331/18, 25, 331/55, 146
See application file for complete search history.

(56) References Cited

U.S. PATENT DOCUMENTS

| | | | | |
|---|---|---|---|---|
| 5,113,416 A | * | 5/1992 | Lindell | 375/344 |
| 5,249,305 A | * | 9/1993 | Wieczorek et al. | 455/517 |
| 5,542,095 A | * | 7/1996 | Petranovich | 455/76 |
| 5,579,346 A | * | 11/1996 | Kanzaki | 375/344 |
| 5,894,594 A | * | 4/1999 | Kang | 455/412.1 |
| 5,943,606 A | * | 8/1999 | Kremm et al. | 455/12.1 |
| 5,995,850 A | * | 11/1999 | Goud et al. | 455/560 |
| 6,304,749 B1 | * | 10/2001 | Obara | 455/126 |
| 6,463,264 B1 | * | 10/2002 | Obara | 455/127.2 |
| 6,760,571 B2 | * | 7/2004 | Prockup | 455/113 |
| 2001/0046847 A1 | * | 11/2001 | Wakamatsu et al. | 455/260 |
| 2002/0081989 A1 | * | 6/2002 | Boloorian | 455/313 |

* cited by examiner

*Primary Examiner*—Edward F. Urban
*Assistant Examiner*—Nhan T. Le

(57) ABSTRACT

A frequency tracking circuit and method comprising a master crystal oscillator circuit is used for frequency tracking between a handset and a base station comprising a calibration subsystem for taking a temperature measurement, a reference control circuit for determining a numerical value needed to align a handset frequency with a base station frequency, an adder for adding the numerical value to a previous numerical value determined by the reference control circuit, a latch for latching the output of the adder, and a low precision master crystal oscillator for clocking the frequency of the latch. The most significant bit from the latch is input into a phase/frequency detector for forcing a voltage controlled oscillator to track a desired frequency.

21 Claims, 5 Drawing Sheets

METHOD OF CALIBRATING PLL FREQUENCY SYNTHESIZERS TO PRECISE FREQUENCIES WITH LOW TOLERANCE CRYSTALS IN THEIR MASTER REFERENCE OSCILLATORS

BACKGROUND OF THE INVENTION

1. Field of the Invention

This invention relates generally to producing an accurate desired output frequency and channel spacing while using crystals with much lower tolerance requirements than normally required and no "pull ability" requirement. More particularly, it relates to a system and method for producing an accurate desired output frequency and channel spacing using a numerically controlled oscillator ("NCO") instead of a conventional integer reference divider to generate a reference frequency used in a frequency synthesizer.

2. Background of Related Art

Cord less telephone, cellular, and wireless local area network ("LAN") and personal area network ("PAN") and user terminals generally employ frequency synthesizers to generate signals, including transmitter output signals, local oscillators, etc. Each user terminal's synthesizer generates these frequencies based on a local master oscillator, invariably a crystal oscillator. Such crystal oscillators have finite tolerances.

A typical way to synchronize two communicating units has been to make one of the units a timing slave to the other unit. In a digital cord less telephone, for example, a base station may serve as a timing master and a handset may serve as a timing slave. In such an arrangement, the receive timing of the handset may be derived from the base station transmission timing via a signal received by the handset from the base station. The transmit timing of the hand unit may then be derived, for example, from the receive timing as is typical. In this manner, synchronization of the timing among the base station and the handset is achieved.

A typical arrangement for achieving synchronization according to this typical synchronization scheme employs a phase lock loop in the slave unit, presumed herein to be the handset (for purposes of discussion only, and not intended to be limited to that case). The phase lock loop serves to lock on the signal received by the handset and to recover a timing signal, i.e., a clock signal, from that received signal. The received signal itself is then utilized by the handset to dictate the handset timing. In this configuration, transmit timing of the handset is derived directly from the receive timing, and the phase lock loop is employed to compensate for jitter of the received signal and to lock on that signal in order to derive transmit timing. When the received signal so dictates timing of the handset, the handset acts as a timing slave to the base station, thereby resulting in synchronization.

The frequencies generated by user terminals and base/master stations must align accurately for proper system operation and to avoid undue interference to users of adjacent channels. These factors generally result in the necessity to use relatively high precision (and therefore relatively expensive) crystal oscillators in both the user terminals and the base/master stations.

Some current cord less telephone systems use a varactor diode to adjust a frequency of a handset's master oscillator, in combination with a processor-based software algorithm, driven by an estimate or measurement of a frequency offset between a handset and its companion base station, to control a digital-to-analog converter (DAC). The DAC's output is used as a control voltage to the varactor diode to align the handset's master oscillator with that of a companion base station.

A disadvantage of using a varactor diode is that it is frequently an additional external component, along with additional associated passive components, on a printed circuit board ("PCB"), taking up valuable PCB area and adding cost. External varactor diode circuits also subject the master oscillator to a certain degree of vulnerability to external noise modulation of the varactor diode, thus degrading the spectral purity of the handset's master oscillator. Careful design and layout can minimize this latter disadvantage, but the risk still exists, sometimes requiring additional shielding and filtering which further consume PCB area and adds cost.

Additionally, the crystal employed in the handset's master oscillator must be specified for a specific degree of "pull ability", which adds to the cost and can result in the necessity of employing larger crystal packages than would otherwise be necessary, were it not for the "pull ability" requirement.

FIG. 1 illustrates a conventional circuit utilizing a master crystal oscillator circuit 1 connected to one side of a phase/frequency detector 2. A second input to the phase/frequency detector 2 is produced by the output of modulus control logic 3. A dual modulus prescaler 4 feeds the modulus control logic 3 and receives a signal from the modulus control logic 3. A voltage controlled oscillator 5 outputs to the dual modulus prescaler 4 and receives a filtered control voltage, filtered by low pass filter 6, from the phase/frequency detector 2.

In operation, master crystal oscillator circuit 1 produces a square-wave Fref that is applied to a first input of phase/frequency detector 2. The phase/frequency detector 2 produces a voltage based on the difference between the square-wave produced by master crystal oscillator circuit 1 and the frequency of the signal produced by modulus control logic 3. Phase/frequency detector 2 produces a control voltage that is output to VCO 5. The control voltage contains a ripple component at $F_{ref}$ that causes undesirable sidebands at the VCO 5 output frequency $+-F_{ref}$. Low pass filter 6 removes the ripple components, suppressing these "reference spurs," dampens transient responses, such as when changing frequencies, and is used to optimize settling time and other loop parameters. One output from VCO 5 is output to a dual modulus prescaler 4, which alternately divides the frequency produced by VCO 5 by either a P or P+1 value.

Modulus control logic 3 is controlled by two values A and N, where A is always smaller than N. A and N are programmable counters that decrement simultaneously to their terminal counts and are decoded in the modulus control logic to control the dual modulus prescaler's 4 value to be either P or P+1. A represents the number of cycles of the VCO output for which the dual modulus prescaler 4 divides by P+1. N represents the number of additional cycles of the VCO output (after counter A has decremented to its terminal count) that dual modulus prescaler 4 divides by P. A modulus control signal from the modulus control logic block 3 feeds back to the dual modulus prescaler 4 to change its divisor from P+1 to P, and vise versa, according to the state of the divide-by-A and divide-by-N counters. The output of the A counter in the modulus control logic block 3 is the VCO signal divided to $F_{ref}$ which is applied to the phase/frequency detector 2. In this manner, the control voltage produced by the phase/frequency detector 2 forces the VCO 5 to converge onto a desired frequency.

FIG. 2 illustrates a conventional master crystal oscillator circuit using a digital-to-analog converter 7 connected to a varactor 8. The varactor 8 outputs a control signal to varactor that controls master crystal oscillator 9, whose output is thereafter divided by the "reference divider" 10 to create a reference frequency for a frequency synthesizer.

In operation, the DAC 7 produces a control voltage for varactor 8 based on a software algorithm. The software algorithm can be adjusted during the manufacturing phase of the circuit to compensate for individualistic characteristics of the master crystal oscillator 9. Varactor 8, based on the control voltage produced by DAC 7, adjusts the frequency produced by the master crystal oscillator 9.

The frequency produced by the master crystal oscillator 9 is divided by the divider 10 by a value R. R is typically the channel spacing between the different possible channels available for transmission and reception. A square-wave reference frequency $F_{ref}$ is output from the divider 10 to the phase/frequency detector 2 in FIG. 1.

FIG. 3 illustrates a second conventional master crystal oscillator circuit using a master crystal oscillator 13 connected to an initial calibration adjustment circuit 11, a temperature compensation circuit 12 and a divider 14.

In operation, the initial calibration adjustment circuit 11 is set or programmed during manufacture of the master crystal oscillator circuit to set the master crystal oscillator to operate on the desired frequency at some nominal temperature.

Temperature compensation circuit 12 may be comprised in a variety of ways from a variety of components such as a varistor/resistor bridge or other temperature sensing device, a micro controller, non-volatile memory, a digital-to-analog converter, a varactor, etc. The temperature compensation circuit 12 changes the varactor control voltage value according to variations in temperature to produce a constant output frequency. The varactor performs as the varactor in FIG. 2, wherein the varactor "pulls" the frequency of the master crystal oscillator 13 to adjust the frequency produced by the master crystal oscillator 13.

The frequency signal produced by the master crystal oscillator 13 is divided by divider 14 by a value R. R is typically the channel spacing between the different possible channels available for transmission and reception. The resulting square-wave reference frequency $F_{ref}$ is output from the divider 14 to the phase/frequency detector 2 in FIG. 1.

It should be noted that in some implementations it is possible to combine the initial calibration circuit and the temperature compensation circuit into a single dual-purpose circuit that serves both purposes.

There exists a need for an apparatus and method that offers a higher level of integration and does not rely on expensive high accuracy crystals. There exists a need for crystals with a specified "pull ability" combined with relatively complex circuits, and a varactor and associated circuitry for the generation of an accurate desired output frequency and channel spacing in user terminals which align appropriately with the frequencies and channel spacings of a companion base/master station.

SUMMARY OF THE INVENTION

In accordance with the principles of the present invention a 1-bit (square wave) output numerically controlled oscillator (NCO) is used instead of a conventional divide by R divider to generate a reference frequency $F_{ref}$ for a frequency synthesizer. A low precision master crystal oscillator clocks the NCO, with a phase increment value, REFCTL, being added to a previously-stored value fed back from the output of a latch at each "tick" of the master crystal oscillator clock. The frequency of the master oscillator and the value of the phase increment value, REFCTL, determine the value of $F_{ref}$. The most significant bit from the latch is a square wave signal at $F_{ref}$ that is input into a phase/frequency detector and loop filter arrangement to force a voltage controlled oscillator to track a desired frequency in an otherwise conventional manner.

A master crystal oscillator circuit in accordance with another aspect of the present invention comprises a master crystal oscillator circuit that compensates for variations in temperature to produce a stable $F_{ref}$ over a wide range of temperature variations. A calibration subsystem takes temperature measurements that are monitored by a controller element that in turn employs that value to access a particular memory location in a non-volatile memory array containing the correct phase increment value for each of a multiplicity of temperatures to constantly produce the correct value of $F_{ref}$ as temperature varies. The values in the non-volatile memory array are programmed during the manufacture of the master crystal oscillator circuit by cycling the circuit over the desired range of temperatures, determining, for each temperature, the phase increment value necessary to compensate for the frequency variation with temperature of that individual master crystal oscillator circuit's crystal at that temperature, and storing that phase increment value into the memory location corresponding to that particular temperature.

A master crystal oscillator circuit in accordance with another aspect of the present invention comprises a master crystal oscillator circuit that allows the frequency synthesizer in a first node of a communications system (e.g., a handset in a cord less telephone system, a handset in a telephone system, or a wireless LAN terminal) to accurately track the frequency of a second node in the system. The first node communicates with the second node (e.g., a cord less telephone or cellular telephone base station, or the access point or another terminal in a wireless LAN system), and as the frequency of the second node may vary, communication is maintained while allowing the use of a low precision crystal in the first node.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a method and apparatus for providing a master crystal oscillator circuit that does not rely on expensive high accuracy crystals, expensive and relatively complex circuits such as a DAC, a varactor and micro controller for the production of a high accuracy reference frequency generator.

Figure 4:
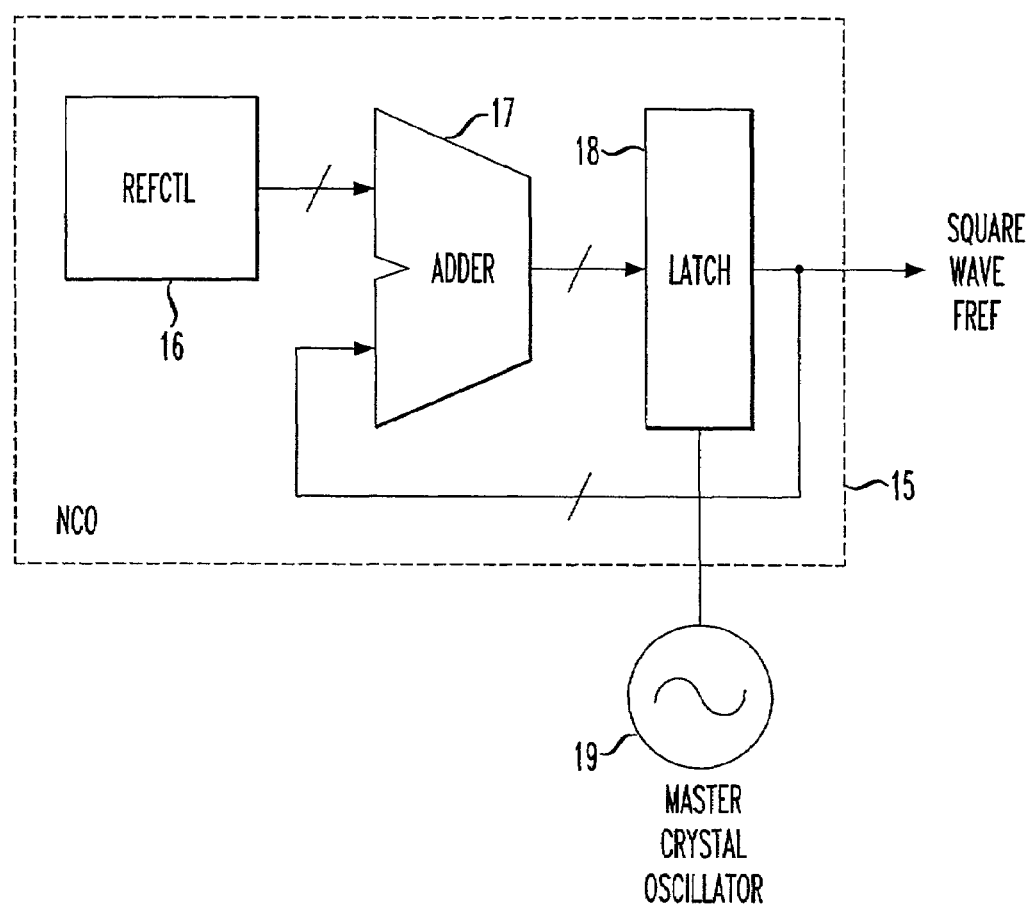
FIG. 4 shows a master crystal oscillator circuit utilizing a 1-bit (square wave) output numerically controlled oscillator in conjunction with a low cost, low precision master crystal oscillator in accordance with the principles of the present invention.

FIG. 4 shows master crystal oscillator circuit including a numerically controlled oscillator (NCO) replacing the conventional DAC, varactor and divider, in accordance with the principles of the present invention.

In particular, the master crystal oscillator circuit shown in FIG. 4 includes a first embodiment in accordance with the principles of the present invention utilizing a numerically controller oscillator (NCO) 15 comprised of a reference control (REFCTL) circuit 16, an adder 17, and a latch 18. An inexpensive low accuracy master crystal oscillator 19 clocks the NCO 15.

In operation, the REFCTL circuit 16 produces a phase increment value that is input to the adder 17, thus controlling the output frequency. The phase increment value is a numerical value determined by a software algorithm to generate the correct $F_{ref}$ to align the handset/user terminal's synthesizer output with that of its companion base/master station, thus achieving frequency tracking and alignment. REFCTL circuit 16 can either be set to a permanent value to compensate for a particular master crystal used within the circuit, or for greater accuracy be configured during manufacturing to compensate for variations possible in different particular master crystal oscillators.

Figure 1:
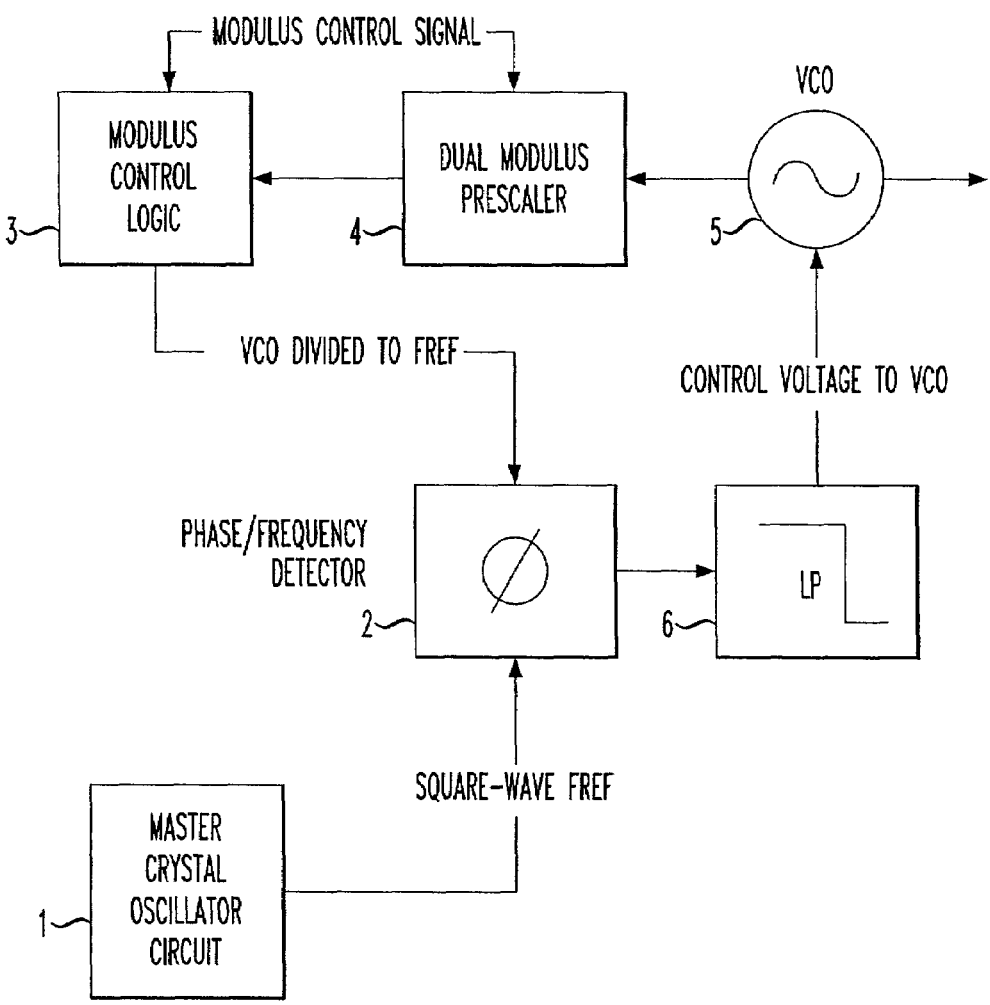
FIG. 1 shows a conventional configuration of a phase lock loop frequency.
Figure 2:
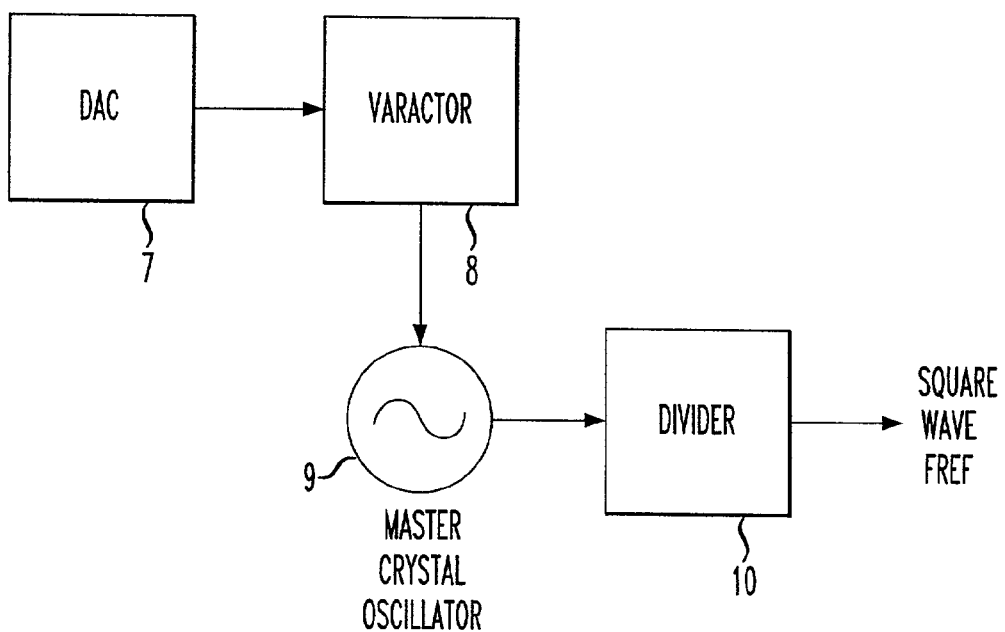
FIG. 2 shows a prior art example of a master crystal oscillator circuit relying on a DAC, varactor and high accuracy master crystal oscillator to align a handset's master oscillator with that of a companion base station.
Figure 3:
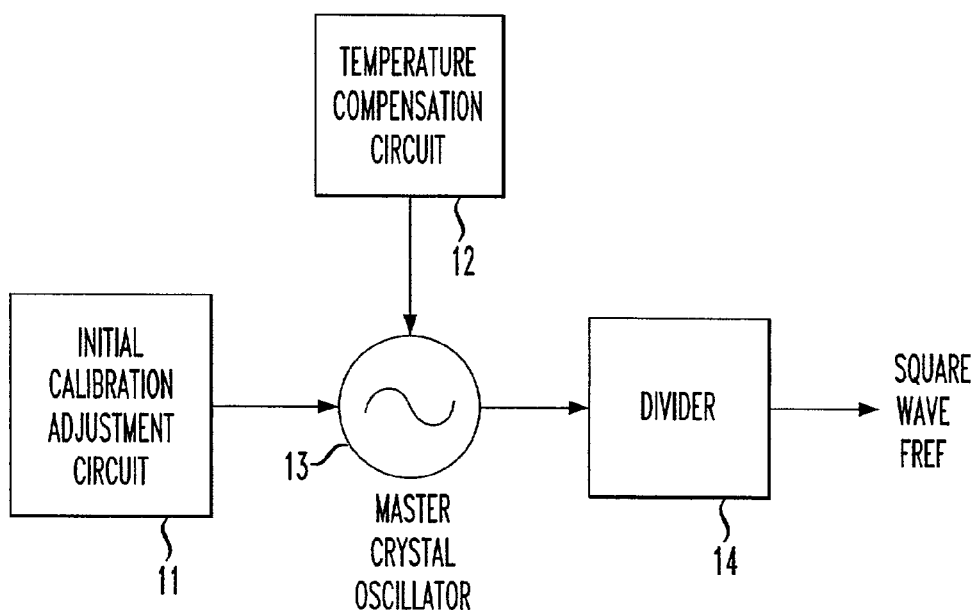
FIG. 3 shows a prior art example of a master crystal oscillator circuit relying on an initial calibration circuit, a temperature compensation circuit, and a high accuracy master crystal oscillator to align a handset's master oscillator with that of a companion base station.

Adder 17 takes as a first input the current REFCTL values, and as a second input the prior value as output from latch 18. The added values from the two inputs of adder 17 are output to the input of latch 18. Latch 18 is clocked by a low cost, low precision master crystal oscillator 19. Latch 18 latches at the frequency of the master crystal oscillator 19. The most significant bit (MSB) of latch 18 is output to the phase/frequency detector of FIG. 1. In this manner, the MSB output is a square wave alternating output $F_{ref}$ of the frequency to drive the circuit of FIG. 1 to align the handset/user terminal's synthesizer output with that of its companion base/master station, thus achieving frequency tracking and alignment. Because of its 1-bit output precision, this is commonly referred to as a 1-bit NCO.

Figure 5:
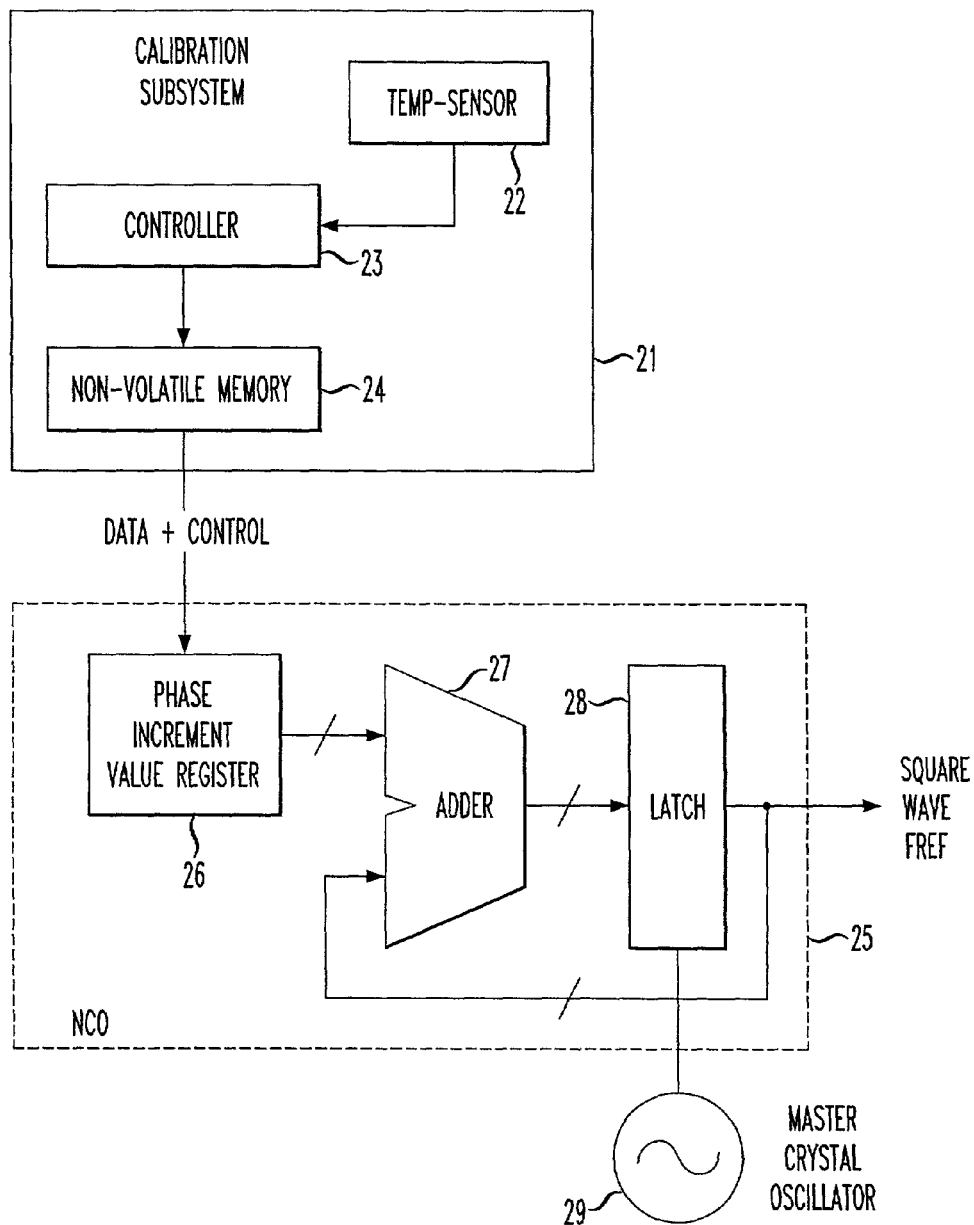
FIG. 5 shows a master crystal oscillator circuit utilizing a numerically controlled oscillator in conjunction with a calibration subsystem and a low cost, low precision master crystal oscillator for frequency tracking, in accordance with the principles of the present invention.

FIG. 5 shows master crystal oscillator circuit including a numerically controlled oscillator (NCO) and calibration subsystem replacing the conventional initial calibration adjustment circuit and temperature compensation circuit, in accordance with the principles of the present invention.

In particular, the master crystal oscillator circuit shown in FIG. 4 includes a second embodiment in accordance with the principles of the present invention utilizing a calibration subsystem 21 comprised of a temperature sensor 22, a controller 23 and non-volatile memory 24, and a numerically controller oscillator (NCO) 25 comprised of a phase increment value register 26, an adder 27, and a latch 28. An inexpensive low accuracy master crystal oscillator 29 clocks the NCO 25. Optionally, an inexpensive low accuracy master crystal clocking an NCO may be used as a clock for a controller in a calibration subsystem and/or for other purposes in a host system.

In operation, the temperature sensor 22 is used to monitor the temperature of the environment in which the circuit will be operating. Calibration values are stored, typically at the time of manufacture, in the non-volatile memory 24 which contains the frequency characteristics of the master crystal oscillator 29 at various possible operating temperatures. As discussed above, crystal oscillators vary in their individual characteristics based on temperature variations because each crystal oscillator is unique. The controller 23 is used to control the transfer of the calibration values from the temperature sensor 22 and the non-volatile memory 24 to the phase increment value register 26.

The phase increment value register 26 is a table of temperature and phase increment values. The value from the phase increment value register 26 is input to the adder 17. The phase increment value register 26 data is a numerical value determined by a software algorithm to generate the correct $F_{ref}$ to align the handset/user terminal's synthesizer output with that of its companion base/master station, thus achieving frequency tracking and alignment.

Adder 27 takes as a first input the phase increment value register 26, and as a second input the prior value as output from latch 28. The added values from the two inputs of adder 27 are output to the input of latch 28. Latch 28 is clocked by a low cost, low precision master crystal oscillator 29. Latch 28 latches at the frequency of the master crystal oscillator 29. The MSB of latch 28 is output to the phase/frequency detector of FIG. 1. In this manner, the MSB output is a square wave alternating output $F_{ref}$ of the frequency to drive the circuit of FIG. 1 to align the handset/user terminal's synthesizer output with that of its companion base/master station, thus achieving frequency tracking and alignment. Because of its 1-bit output precision, this is commonly referred to as a 1-bit NCO.

An additional benefit over the prior art method of calibrating the operation of a master crystal oscillator is that temperature sensor data does not need to be converted by a DAC to control the oscillator, thus eliminating a DAC, varactor, etc. and associated cost and complexity from the circuit.

The accuracy of the frequency $F_{ref}$ produced by the NCO and master crystal oscillator combination is dependent on the width of the latch 18 and 28 in FIG. 4 and 5 respectively. The larger the width of the latch, the greater the frequency resolution or "granularity" of the signal $F_{ref}$, e.g., 8 bits versus 16 bits. A balance is made between the cost and complexity associated with creating a master crystal oscillator circuit containing wider buses and greater precision components with the accuracy needed to align the handset/user terminal's synthesizer output with that of its companion base/master station, thus achieving frequency tracking and alignment.

Initial calibration of $F_{ref}$ for different crystals by using a 1-bit NCO in place of a more conventional "divide by R" circuit allows the complete elimination of a typically required external components (trimmer capacitor, DAC/varactor, etc.) to adjust a frequency of a master oscillator to a desired frequency. Since the phase increment value is just a numerical representation stored in a memory element or register, the phase increment value can be totally integrated on an IC chip and programmed by software, totally eliminating components for "crystal by crystal" calibration.

Temperature compensation by sensing temperature alternately can have the temperature sensor integrated on chip. The sensed temperature can be used to access a correct phase increment value from a table programmed in memory. Temperature compensation can be accomplished without external components.

Frequency tracking between nodes in a system, assuming that a base/master station serves as a system reference, is accomplished by other system nodes adjusting their own master oscillators to achieve proper alignment with the base/master station. The other system nodes sense their frequency offset while receiving signals from a system reference station and adjust a phase increment value accordingly to achieve alignment. In some systems, e.g., cellular, base stations use a more precise reference oscillator which allows a user terminal to use cheaper oscillators by "inheriting" a higher stability of a base station by use of a tracking algorithm.

In other systems, e.g., cordless telephones, an exact frequency of operation and channel spacing may not be so important, so the initial calibration tolerance of a base station may be comparable to that in a handset.

Although the present invention is described with reference to embodiments using a low cost, low accuracy crystal to accurately align a handset/user terminal's with a base/master station frequency, the principles of the present invention are equally applicable to frequency tracking, e.g, radio, GPS, BLUETOOTH, etc.

While the invention has been described with reference to the exemplary embodiments thereof, those skilled in the art will be able to make various modifications to the described embodiments of the invention without departing from the true spirit and scope of the invention.

What is claimed is:

1. A master crystal oscillator circuit for use in frequency tracking between a transmitter and a receiver comprising:
   a reference control circuit pre-configured with a numerical value needed to compensate for a low precision master crystal;
   an adder to add said numerical value to a previous numerical value determined by said reference control circuit;
   a latch receiving an output of said adder, said latch being clocked by said low precision master crystal; and
   a phase/frequency detector;
   wherein said latch outputs a most significant bit of a latched data as a square wave reference frequency for comparison by said phase/frequency detector; and
   said low precision master crystal is used to clock at least one of a high precision frequency in said receiver and a high precision frequency in said transmitter.

2. The master crystal oscillator circuit for use in frequency tracking between a transmitter and a receiver according to claim 1, wherein:
   said numerical value is determined by a software algorithm.

3. The master crystal oscillator circuit for use in frequency tracking between a transmitter and a receiver according to claim 1, wherein:
   an output from said latch is a second input to said adder.

4. The master crystal oscillator circuit for use in frequency tracking between a transmitter and a receiver according to claim 1, wherein:
   said latch is 8 bits wide.

5. The master crystal oscillator circuit for use in frequency tracking between a transmitter and a receiver according to claim 1, wherein:
   said latch is 16 bits wide.

6. The master crystal oscillator circuit for use in frequency tracking between a transmitter and a receiver according to claim 1, wherein:
   said numerical value is adjustable to compensate for a variation in a particular master crystal oscillator.

7. The master crystal oscillator circuit for use in frequency tracking between a transmitter and a receiver according to claim 1, wherein:
   said numerical value is set permanently.

8. A method of frequency tracking between a transmitter and a receiver using a master crystal oscillator circuit comprising:
   pre-configuring a numerical value needed to compensate for a low precision master crystal with a reference control circuit;
   adding said numerical value with a previous value determined by said reference control circuit to provide an added value; and
   latching said added value, said latching outputting a most significant bit of a latched data as square wave reference frequency for comparison by a phase/frequency detector; and
   clocking said latched added value with a said low precision master crystal;
   wherein said low precision master crystal is used to clock at least one of a high precision frequency in said receiver and a high precision frequency in said transmitter.

9. The method of frequency tracking between a transmitter and a receiver using a master crystal oscillator circuit according to claim 8, wherein:
   said numerical value is determined by a software algorithm.

10. The method of frequency tracking between a transmitter and a receiver using a master crystal oscillator circuit according to claim 8, wherein:
    an output from said latching is a second input added by said step of adding.

11. The method of frequency tracking between a transmitter and a receiver using a master crystal oscillator circuit according to claim 8, wherein:
    said latching latches 8 bits.

12. The method of frequency tracking between a transmitter and a receiver using a master crystal oscillator circuit according to claim 8, wherein:
    said latching latches 16 bits.

13. The method of frequency tracking between a transmitter and a receiver using a master crystal oscillator circuit according to claim 8, wherein:
    said numerical value is adjusted during manufacture to compensate for a variation in a particular master crystal oscillator.

14. The method of frequency tracking between a transmitter and a receiver using a master crystal oscillator circuit according to claim 8, wherein:
    said numerical value is set permanently.

15. A means of frequency tracking between a transmitter and a receiver using a master crystal oscillator circuit comprising:
    means for pre-configuring a numerical value needed to compensate for a low precision master crystal with a reference control circuit;
    means for adding said numerical value with a previous value determined by said reference control circuit to provide an added value; and
    means for latching said added value, said means for latching outputting only a most significant bit of latch data as square wave reference frequency for comparison by a phase/frequency detector; and means for clocking said latched added value with a said low precision master crystal;

wherein said low precision master crystal is used to clock at least one of a high precision frequency in said receiver and a high precision frequency in said transmitter.

16. The means of frequency tracking between a transmitter and a receiver using a master crystal oscillator circuit according to claim 15, wherein:

said numerical value is determined by a software algorithm.

17. The means of frequency tracking between a transmitter and a receiver using a master crystal oscillator circuit according to claim 15, wherein:

an output from said means for latching is a second input added by said means for adding.

18. The means of frequency tracking between a transmitter and a receiver using a master crystal oscillator circuit according to claim 15, wherein:

said means for latching latches 8 bits.

19. The means of frequency tracking between a transmitter and a receiver using a master crystal oscillator circuit according to claim 15, wherein:

said means for latching latches 16 bits.

20. The means of frequency tracking between a transmitter and a receiver using a master crystal oscillator circuit according to claim 15, wherein:

said means for pre-configuring determines a numerical value during manufacture to compensate for variations in a particular master crystal oscillator.

21. The means of frequency tracking between a transmitter and a receiver using a master crystal oscillator circuit according to claim 15, wherein:

said means for pre-configuring sets said numerical value permanently.

* * * * *